(12) United States Patent
Assaad et al.

(10) Patent No.: US 10,916,653 B2
(45) Date of Patent: *Feb. 9, 2021

(54) TRANSIENT-INSENSITIVE LEVEL SHIFTER

(71) Applicant: TEXAS INSTRUMENTS INCORPORATED, Dallas, TX (US)

(72) Inventors: Rida Shawky Assaad, Murphy, TX (US); Angelo William Pereira, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 43 days.

This patent is subject to a terminal disclaimer.

(21) Appl. No.: 16/160,470

(22) Filed: Oct. 15, 2018

(65) Prior Publication Data
US 2019/0207026 A1 Jul. 4, 2019

Related U.S. Application Data

(63) Continuation of application No. 15/857,214, filed on Dec. 28, 2017, now Pat. No. 10,103,261.

(51) Int. Cl.
*H01L 29/78* (2006.01)
*H03K 19/0185* (2006.01)

(52) U.S. Cl.
CPC . *H01L 29/7835* (2013.01); *H03K 19/018507* (2013.01)

(58) Field of Classification Search
CPC ............ H01L 29/7835; H03K 19/018507
See application file for complete search history.

(56) References Cited

U.S. PATENT DOCUMENTS

| 9,979,397 | B1* | 5/2018 | Zhu | H03K 19/01750 |
| 10,103,261 | B1* | 10/2018 | Assaad | H01L 29/7835 |
| 10,270,448 | B1* | 4/2019 | Blutman | H03K 19/01852 |
| 10,498,315 | B2* | 12/2019 | Jodka | H03K 3/356165 |
| 2003/0107403 | A1 | 6/2003 | Tanaka et al. | |
| 2003/0179032 | A1 | 9/2003 | Kaneko et al. | |
| 2007/0247210 | A1 | 10/2007 | Maede et al. | |

(Continued)

OTHER PUBLICATIONS

International Search Report for PCT/US2018/065231 dated Apr. 4, 2019.

(Continued)

*Primary Examiner* — Dylan C White
(74) *Attorney, Agent, or Firm* — Michael A. Davis, Jr.; Charles A. Brill; Frank D. Cimino

(57) ABSTRACT

In a described example, an apparatus includes at least one latch coupled to a first positive supply voltage and to a first negative supply voltage, the latch having a first inverter and a second inverter coupled to one another back to back, to output a first voltage corresponding to a first latch state and a second voltage corresponding to a second latch state responsive to a first set signal and a first reset signal. An isolation circuit is coupled to a second positive supply voltage and to a second negative supply voltage and is coupled to receive a second set signal, and a second reset signal. The second positive supply voltage is independent of the first positive supply voltage. The isolation circuit outputs the first set signal and the first reset signal and includes less than two pairs of drain extended metal oxide semiconductor (DEMOS) transistors.

31 Claims, 7 Drawing Sheets

(56) References Cited

U.S. PATENT DOCUMENTS

| | | |
|---|---|---|
| 2009/0224817 A1 | 9/2009 | Nakamura et al. |
| 2011/0115538 A1 | 5/2011 | Jansson |
| 2014/0266306 A1 | 9/2014 | Cullinane |
| 2014/0354342 A1 | 12/2014 | Lou |
| 2017/0170819 A1* | 6/2017 | Kanda .................. H01L 29/404 |
| 2020/0127663 A1* | 4/2020 | Lee .................. H03K 19/01852 |

OTHER PUBLICATIONS

Yashodhan Moghe, Torsten Lehmann, Tim Piessens, "Nanosecond Delay Floating High Voltage Level Shifters in a 0.35 um HV-CMOS Technology," IEEE Journal of Solid-State Circuits, vol. 46, No. 2, Feb. 2011, pp. 485-497, accessed Dec. 27, 2017, http://web.mit.edu/Magic/Public/papers/05661865.pdf.

* cited by examiner

TRANSIENT-INSENSITIVE LEVEL SHIFTER

CROSS-REFERENCE TO RELATED APPLICATION

This application is a continuation of U.S. patent application Ser. No. 15/857,214 filed Dec. 28, 2017, which is fully incorporated herein by reference.

BACKGROUND

This relates generally to level shifter circuitry to shift signals between independent voltage domains.

Level shifters, sometimes called level translators, interface between lower voltage circuitry and higher voltage circuitry (e.g., in logic systems and/or power systems), such as by safely translating signals between the higher voltage circuitry and the lower voltage circuitry. For example, a level shifter may isolate and protect the lower voltage circuitry against higher voltages (from the higher voltage circuitry) that could otherwise damage the lower voltage circuitry.

Example applications for level shifters include automotive systems. In an automotive system, the battery voltage is a DC voltage that can vary from as low as 3 volts to as high as 40 volts, depending on alternator or generator operation, ambient or engine temperature, and loading, while a nominal battery voltage is about 12 volts. Automotive systems include power field effect transistors ("power FETs"), but these power FETs are not rated for a full range of battery voltages that might occur. Instead, these power FETs may have an example safe voltage range of 3.3 to 5 volts for a gate-to-source voltage (Vgs), and they may have low on-resistance and low capacitance. To avoid permanently damaging these power FETs, the automotive system must ensure that gate voltages are within the safe voltage range.

Additional applications for level shifters include switching power converters that can require operating frequencies as high as 10 MHz on an input terminal. In a DC-DC converter application, the level shifter speed (at least in part) restricts a minimum duty cycle that the switching converter can use and thus limits a level of voltage conversion that can be achieved. For example, in some converters, the level shifters must have fast rise and fall times (Tr, Tf) to achieve the required operating frequencies, such as less than 5 nanoseconds.

Some level shifters include drain extended metal oxide semiconductor (DEMOS) transistors. A DEMOS transistor has an extended and lightly doped drain area that reduces an electric field under its gate. This reduced electric field increases a drain-to-source ($V_{DS}$) breakdown voltage (in comparison to other MOS transistors), so a DEMOS transistor is useful to interface between two power domains that have different voltage operating levels, because the DEMOS transistor is suitable for coupling to different levels of voltages. In comparison to other MOS transistor types, DEMOS transistors have more parasitic capacitance, and occupy more silicon area.

Also, level shifters with DEMOS transistors devices can exhibit asymmetric signal translation, high power usage and low bandwidth.

SUMMARY

In a described example, an apparatus includes at least one latch coupled to a first positive supply voltage and to a first negative supply voltage. The latch has a first inverter and a second inverter coupled to one another back to back, and the latch is coupled to output a first voltage corresponding to a first latch state and a second voltage corresponding to a second latch state responsive to a first set signal and a first reset signal. An isolation circuit is coupled to a second positive supply voltage and to a second negative supply voltage and is coupled to receive a second set signal, a second reset signal, and an enable signal. The second positive supply voltage is independent of the first positive supply voltage. The isolation circuit is coupled to output the first set signal and the first reset signal responsive to the second set signal and the second reset signal, and the isolation circuit includes less than two pairs of drain extended metal oxide semiconductor (DEMOS) transistors.

DETAILED DESCRIPTION OF EXAMPLE EMBODIMENTS

Figure 1:
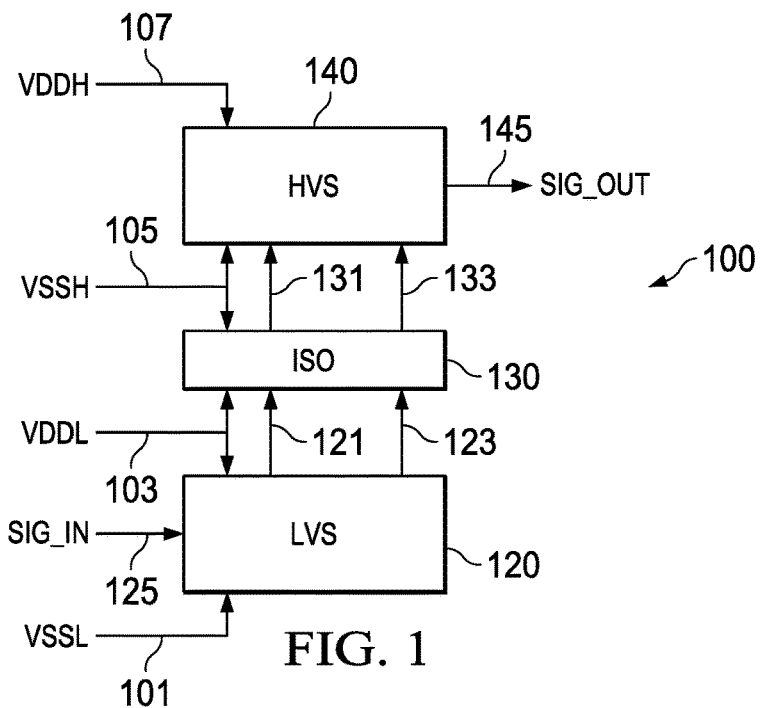
FIG. 1 is a block diagram of a level shifter.

In the drawings, corresponding numerals and symbols generally refer to corresponding parts unless otherwise indicated. The drawings are not necessarily drawn to scale. The term "coupled" may include connections made with intervening elements, and additional elements and various connections may exist between any elements that are "coupled."

In the examples described hereinbelow, circuits are described as having "zero quiescent power." Quiescent power is the power consumed by design, such as power used due to a bias current, or power used to maintain a stable circuit state. Quiescent power is the power consumed when a circuit is not changing state. A circuit with "zero quiescent power" is one that does not consume power when the circuit is stable and not changing state. A circuit with zero quiescent power will nonetheless have some negligible power consumption due to leakage current. Leakage current is current that inherently flows in a circuit due to semiconductor device physics and which cannot be eliminated. For the purposes of this description, circuitry that has only leakage current flowing when the circuit is not changing state exhibits zero quiescent power.

In this description, an example low voltage domain includes digital logic whose compatible voltage range is about 5 volts or less: between a positive supply voltage and a negative supply voltage; or between a positive supply voltage and a reference voltage (e.g., ground). Similarly, in this description, an example high voltage domain includes digital logic whose compatible voltage range is about 5 to 6 volts or less: between a positive supply voltage and a negative supply voltage; or between a positive supply voltage and a reference voltage (e.g., ground). However, the high voltage domain and the low voltage domain are independent from one another (e.g., floating with respect to one another), so: (a) the high voltage domain's positive supply voltage could be up to hundreds of volts above the low voltage domain's positive supply voltage; and (b) likewise, the high voltage domain's reference voltage could be up to hundreds of volts above the low voltage domain's reference voltage.

FIG. 1 is a block diagram of a level shifter. Level shifter 100 has four power supply lines: a first positive supply voltage VDDH 107, a first negative supply voltage VSSH 105, a second positive supply voltage VDDL 103, and a second negative supply voltage VSSL 101. Level shifter 100 has three sections: a low voltage section (LVS) 120; an isolation section (ISO) 130; and a high voltage section (HVS) 140. Low voltage section 120 receives an input signal SIG_IN 125. The high voltage section HVS 140 has an output signal SIG_OUT 145. In other level shifters, the input could be a high voltage domain signal, and the output could be a low voltage domain signal, and in that case the level shifter could shift signals from the high voltage domain to the low voltage domain. Example arrangements herein are useful in both situations. Two signals 121, 123 couple low voltage section LVS 120 to the isolation section ISO 130. Signals 131, 133 couple ISO 130 to HVS 140.

In operation, LVS 120 receives a low voltage domain input signal on the input SIG_IN 125. In response, the LVS 120 outputs complimentary signals 121, 123 to ISO 130. ISO 130 outputs complimentary signals 131, 133 to the HVS 140. Within the ISO 130 block, elements protect and translate the low voltage domain signals from the LVS 120 to a higher voltage in the high voltage domain sections HVS 140. Ideally, the level shift would be transparent to the other circuits; however, in a practical level shifter circuit, the various circuit elements within the ISO 130 used to interface signals between the low voltage and high voltage systems have certain artifacts.

In an example, drain extended metal oxide semiconductor (DEMOS) transistors are used to isolate the low voltage circuitry from the high voltage domain. A DEMOS transistor has a high breakdown voltage from drain to source (when compared to other metal oxide semiconductor field effect transistors (MOSFETS)). DEMOS transistors are used in the ISO 130 block to couple signals between the LVS 120 and HVS 140. The DEMOS transistors provide high voltage protection for the low voltage circuitry in LVS 120. However, a DEMOS transistor is a physically large transistor with a large parasitic capacitance (when compared to a standard MOSFET transistor). The large parasitic capacitance results in a slow switching speed with low bandwidth at low power or alternatively, results in relatively high power usage for higher bandwidth signals. In alternative examples, laterally diffused metal oxide semiconductor (LDMOS) transistors are useful to shield the low voltage circuitry in the LVS from the high voltages in the HVS.

Resistors (not shown in FIG. 1) can also be used within the ISO 130 block to translate voltages between the LVS 120 and HVS 140. In level shift circuits using resistors, the resistors are selected for specific applications. When lower resistances are selected, the size of the resistor is smaller and the circuit has higher bandwidth. However, a design tradeoff exists, because a low resistance can contribute to high power consumption and to a higher quiescent current. For battery powered applications, high power and/or higher quiescent currents are undesirable due to a corresponding shortened battery life. Using resistors in a level shifter also precludes the possibility of a zero quiescent power system, because a resistive path exists between a power supply and ground, with quiescent current flowing in it, and the circuit consumes quiescent power (even in stable operating conditions).

Figure 2:
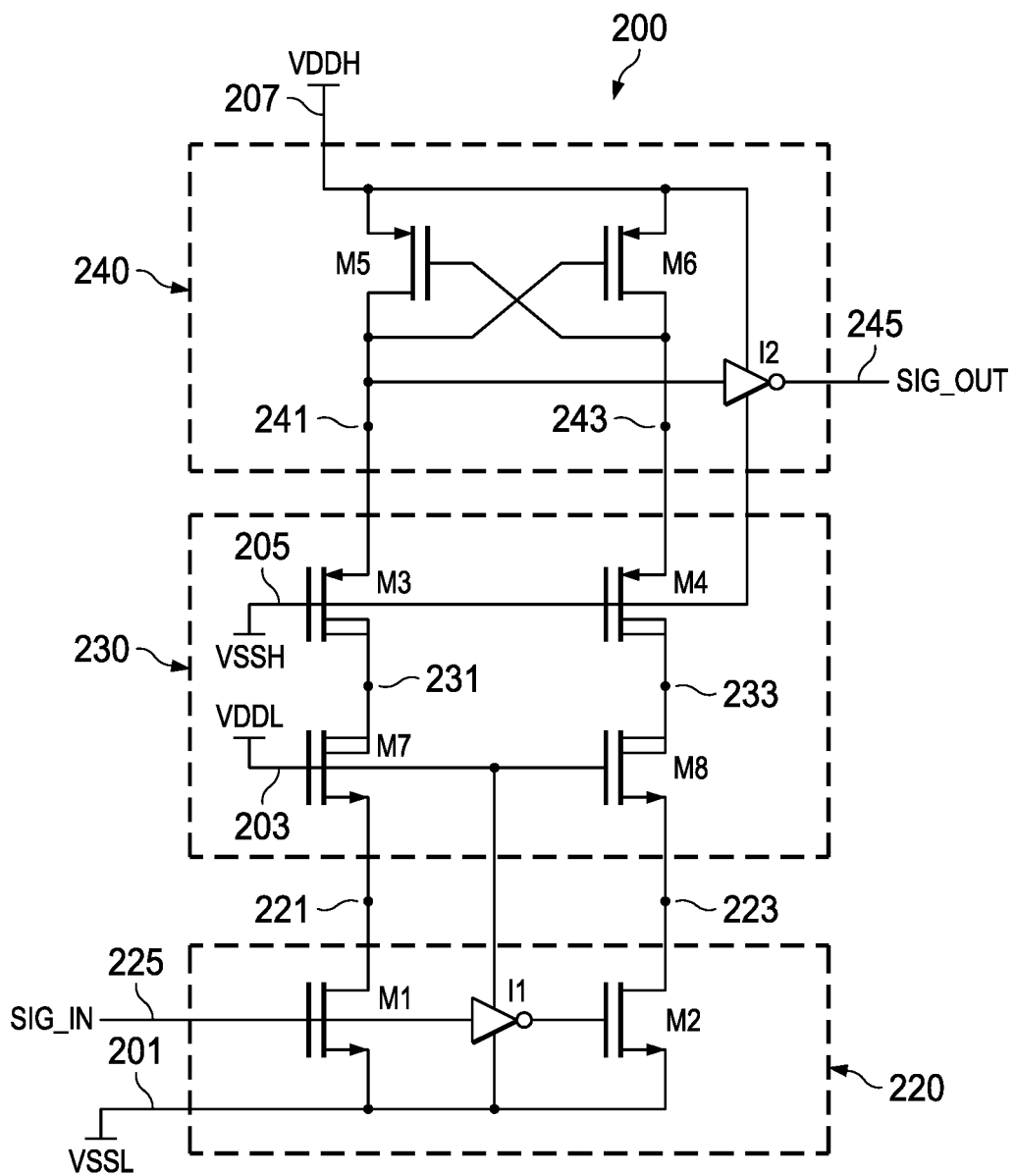
FIG. 2 is a schematic diagram of a prior art level shifter architecture.

FIG. 2 is a circuit diagram of a prior art level shifter 200, which has three sections, namely: LVS 220 (low voltage section); ISO 230 (isolation section); and HVS 240 (high voltage section). In FIG. 2, similar reference labels are used for elements similar to those used in FIG. 1, for clarity. LVS 220 receives a signal on input SIG_IN 225 and an output line SIG_OUT 245 from LVS 220 couples to HVS 240. Two nodes 221, 223 from LVS 220 couple to ISO 230 and the two lines from ISO 230 couple to HVS 240. Level shifter 200 couples a low voltage domain and a high voltage domain. The high voltage domain includes a first positive supply voltage VDDH 207 and a first negative power supply voltage VSSH. The low voltage domain includes a second positive supply voltage VDDL 203 and a second negative supply voltage VSSL 201. In the example, the first positive supply voltage VDDH is a high voltage domain supply and is greater than the second positive supply voltage VDDL, which is a low voltage domain supply. The two positive supply voltages are independent and floating with respect to one another. Similarly, the first negative supply voltage VSSH, which is part of the high voltage domain, and the second negative supply voltage VSSL, which is part of the low voltage domain, are independent and floating with respect to one another.

LVS 220 includes two N-type MOS (NMOS) transistors M1, M2 and an inverter I1. ISO 230 includes two P-type MOS (PMOS) transistors, M3, and M4, and two NMOS transistors, M7, and M8. The four transistors M3, M4, M7, and M8 within ISO 230 are DEMOS transistors. HVS 240 includes two PMOS transistors M5, M6 and inverter I2. Transistors M5 and M6 have gate terminals and drain terminals cross-coupled to form a latch. The input for inverter I2 couples to the node 241 and the output of inverter I2 couples to the output line SIG_OUT 245.

In operation, LVS 220 receives a positive input on input line SIG_IN 225. SIG_IN 225 couples to the gate terminal of transistor M1 and to the input of inverter I1. The output of the inverter I1 couples to the gate of M2. In response to the positive input signal, transistor M1 conducts so that nodes 221, 231 and 241 couple to the second negative supply voltage or ground VSSL 201 by operation of transistor M1. After transistor M1 turns on and conducts, transistors M7 and M3 conduct, pulling node 241 down to a "logic low" voltage. After node 241 goes low, inverter I2 inverts the signal, producing a high signal on output line OUT_H 245 that matches the same polarity as the input pulse. The inverter I2 is supplied by voltages from the high voltage domain including the first positive supply voltage VDDH 207 and the first negative supply voltage VSSH 205, so that the output signal from inverter I2 is at voltages within the high voltage domain. The low at node 241 also turns on transistor M6, which then provides a high voltage at node 243, turning off transistor M5 (which is a PMOS transistor). The cross-coupled transistors M5, M6 act as a latch and reinforce and stabilize the voltages at nodes 243, 241.

In the case of a low going signal at the input SIG_IN, the level shifter 200 operates in a similar fashion as described hereinabove. Transistor M1 is not conducting in this case, but inverter I1 places a high voltage at the gate of transistor M2, which then turns on and conducts. Transistor M2 couples nodes 223, 233 and 243 to the low voltage domain second negative supply voltage VSSL 201. A low voltage at the gate of transistor M5 turns M5 on, as it is a PMOS device. Transistor M5 couples the high voltage domain first positive supply voltage VDDH 207 to the node 241, which is the input to inverter I2. The inverter I2 then outputs a low signal on the output line SIG_OUT 245, so that the output again tracks the input pulse at line SIG_IN. The high voltage domain voltages VDDH 207 and VSSH 205 supply inverter I2. Therefore, the output voltage on output line SIG_OUT 245 ranges with the first positive supply voltage VDDH and the first negative supply voltage VSSH, and thus the voltage level is shifted from the low voltage domain input signal at SIG_IN to the high voltage domain output signal at SIG_OUT.

The voltages at nodes 231 and 233 will range from near the second negative supply voltage VSSL 201 to near the first positive supply voltage VDDH 207, and at the same time these nodes are coupled to the high parasitic capacitance from the two DEMOS transistors pairs M3, M7; and M4, M8. The DEMOS transistors are physically large and as a result have large parasitic capacitance. The large parasitic capacitance results in relatively slow transition times for these transistors, and higher dynamic power consumption as the parasitic capacitors are charged and discharged when the circuit changes state. Another artifact of the level shifter 200 in FIG. 2 is that the charge and discharge times of node 231 and 233 are different, because the discharge time through transistors M1, M2 is usually much faster than the charge time through transistors M5, M6. The discharge through NMOS transistors M1, M2 is faster than the discharge for the PMOS transistors M5, M6. Accordingly, the level shifter 200 has asymmetric operating characteristics, which is undesirable.

Figure 3:
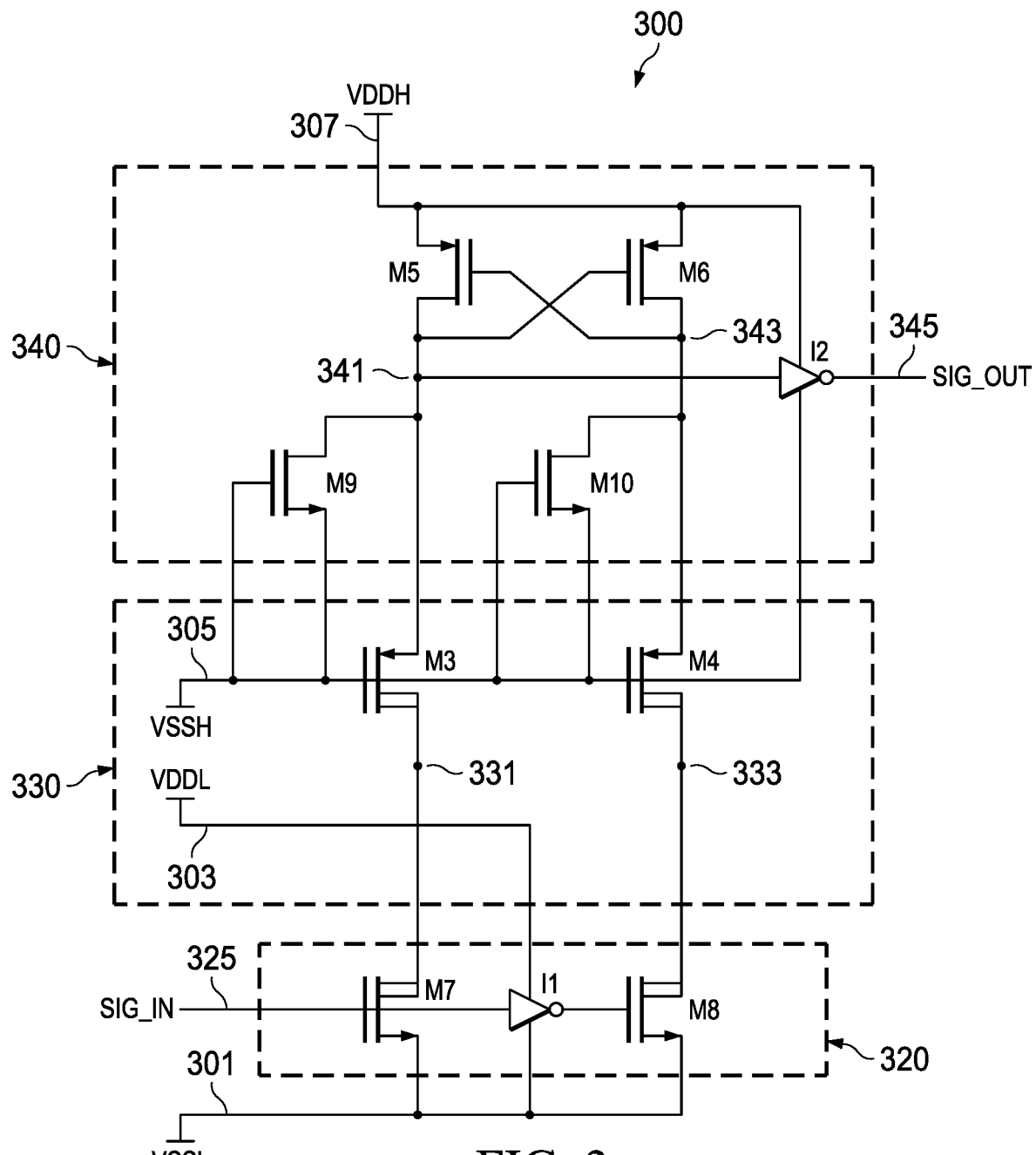
FIG. 3 is schematic diagram of another prior art level shifter architecture.

FIG. 3 is a circuit diagram of another prior art level shifter 300, which has three sections, namely: LVS 320 (low voltage section); ISO 330 (isolation section); and HVS 340 (high voltage section). In FIG. 3, similar reference labels are used for elements similar to FIG. 2, for clarity. LVS 320 receives inputs on an input line SIG_IN 325 and an output signal SIG_OUT 345 couples to the HVS 340. The LVS 320 couples to ISO 330 at the twos nodes 331, 333 and the ISO 330 couples to the HVS 340 with two nodes 341,343. Level shifter 300 couples a low voltage domain and a high voltage domain. The high voltage domain includes a first positive supply voltage VDDH 307 and a first negative supply voltage VSSH 305. The low voltage domain includes a second positive supply voltage VDDL 303 and a second negative supply voltage VSSL 301. An example low voltage domain has a logic compatible voltage range from 0 to 5 or 6 volts. The high voltage domain can have a similar range between the first positive supply voltage VDDH and the first negative supply voltage VSSH. The two domains are independent and floating with respect to one another, and a difference between the low voltage domain second negative supply voltage VSSL and the high voltage domain first negative supply voltage VSSH can range from 0 to 20, 40 or even 100 volts or more (e.g., according to a system's particular specification). The delta between the high voltage domain first positive supply voltage VDDH to the low voltage domain second positive supply voltage VSSH can be anywhere from zero to as much as 100 volts. LVS 320 contains two NMOS transistors M7, M8 and an inverter I1. ISO 330 contains two PMOS transistors M3, M4. In this example transistors M3, M4, M7, and M8 are all DEMOS transistors. HVS 340 contains two PMOS transistors M5, M6, two NMOS transistors M9, M10 and inverter I2. Transistors M5 and M6 have gate and drain terminals that are cross-coupled. Node 341 couples to inverter I2 and the output of inverter I2 couples to the line SIG_OUT 245. Transistors M9 and M10 act as clamping diodes with the gates and sources coupled together. Transistor M9 is diode coupled between the source and gate of M3, and transistor M10 is diode coupled between the source and gate of transistor M4.

Level shifter 300 in FIG. 3 operates in a manner similar to the operation of level shifter 200 of FIG. 2, so the circuit operations for level shifter 300 are not further described herein. The level shifter 300 has a similar structure to level shifter 200 with some differences. In the level shifter 300, the diode coupled transistors M9 and M10 in FIG. 3 prevent the source of the DEMOS transistors M3 and M4 from moving more than a diode voltage drop away from the high voltage domain negative supply voltage VSSH. This clamping action reduces the voltage swing on node 341 and protects the gate oxide within the transistors from excessive electric fields (by controlling the maximum gate to source voltages $V_{GS}$ for transistors M3 and M4). In another difference compared to the level shifter 200 in FIG. 2, in the level shifter of FIG. 3 the LVS 320 directly uses the DEMOS transistors M7, M8 for pull down transistors. In the level shifter arrangement of FIG. 3, the elimination of the pull down transistors used in the LVS 220 in FIG. 2 saves silicon space and reduces switching time. However, the nodes 331 and 333 in FIG. 3 still need to charge and discharge the large parasitic capacitances from the two DEMOS transistor pairs including M3, M7 and M4, M8.

An example arrangement for a level shifter reduces the number of DEMOS transistors to less than two pairs of DEMOS transistors, resulting in higher speed operation, while still providing high voltage protection for the low voltage circuitry. The example arrangements also feature a low impedance path to the remaining pair of DEMOS transistors so that the parasitic capacitance in the DEMOS transistors can be rapidly charged and discharged. In some examples, a circuit and method reduces the quiescent power to zero when the level shifter is inactive and not changing state.

Figure 4:
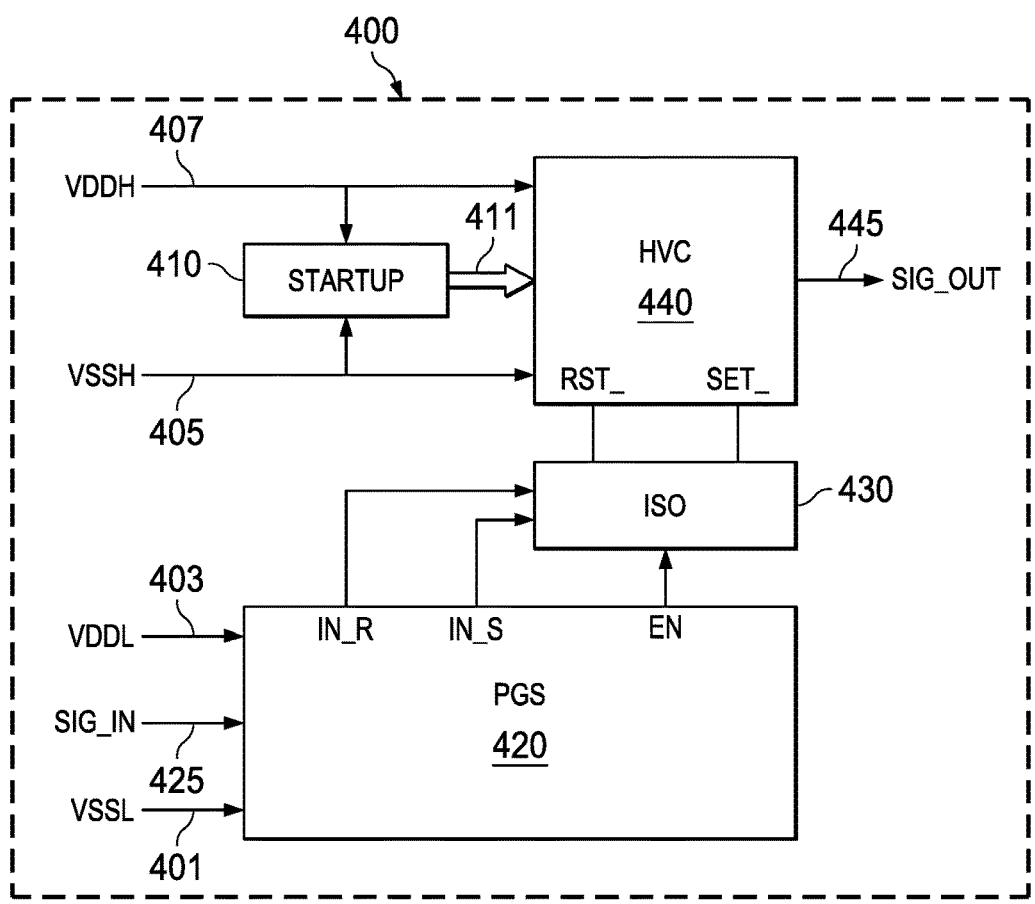
FIG. 4 is a block diagram of an example level shifter with zero quiescent power.

FIG. 4 is a block diagram of an example high speed symmetric level shifter with zero quiescent power. For example, the power consumed during a state without changes at the inputs has a range of picoAmps to nanoAmps. In the arrangements, a current path is closed between input transitions so that no current flows in the circuits in quiescent states, as is further described hereinbelow. In an example a high voltage domain first positive supply voltage is more than twenty volts above a low voltage domain second positive supply voltage. Signals are translated by the example in FIG. 4 from an input in the low voltage domain to an output in the high voltage domain.

Level shifter 400 has four blocks, which are: STARTUP 410; PGS (pulse generator section) 420; ISO (isolation) 430; and HVC (high voltage core) 440.

Level shifter 400 couples a high voltage domain having a first positive supply voltage and a first negative supply voltage to a low voltage domain having a second positive supply voltage and a second negative supply voltage. The low voltage domain includes the second negative supply voltage or ground potential VSSL 401 and the second positive supply voltage VDDL 403. These voltages couple to the pulse generation section PGS 420 and the isolation section ISO 430. The high voltage domain includes the first negative supply voltage VSSH 405 and the first positive supply voltage VDDH 407 coupled to STARTUP 410 and HVC 440. The input SIG_IN 425 is a low voltage domain signal, while the output SIG_OUT 445 is a high voltage domain signal. In an example, the low voltage domain second positive supply voltage VDDL 403 can be a "logic high" voltage above the second negative supply voltage VSSL 401, so VDDL can be 5 to 6 volts above VSSL. In an alternative arrangement the logic high can be 3.3 volts, for example, so the second positive supply voltage VDDL 403 can be greater than the second negative supply voltage VSSL by 3.3 volts, or about 3 volts. The high voltage domain first positive supply voltage VDDH can also be a "logic one" voltage above the high voltage domain first negative supply voltage VSSH, for example. Other voltage ranges can be used, such as 3.3V (or even higher ranges, such as 12V) between the negative potential and the positive potential in a voltage domain. As described hereinabove, the two voltage domains are independent from one another and are floating with respect to one another. In an example, the high voltage domain first positive supply voltage VDDH can be several volts above the low voltage domain second positive supply voltage VDDL, such as 20 volts. In alternative examples, the difference can be as great as hundreds of volts as the two domains are independent and floating with respect to one another. In more alternative arrangements, the input signal SIG_IN can be a high voltage domain signal, while the output signal SIG_OUT is a low voltage domain signal.

In FIG. 4, the block STARTUP 410 couples to HVC 440 through output lines 411. Block PGS 420 has an input line SIG_IN 425 and couples to ISO 430 by the lines IN_R, IN_S, and EN. ISO 430 couples to HVC 440 by a line RST_ and a line SET_ from the ISO 430. HVC 440 has an output line SIG_OUT 445. The first reset signal RST_ and the first set signal SET_ are input to the HVC 440, and transition in response to the second set signal IN_S and the second reset signal IN_R, respectively, that are input to the block ISO 430 from the block PGS 420.

In operation, STARTUP 410 ensures that during a power up operation, until the high voltage domain first positive supply voltage VDDH reaches a determined level, the level of the output signal SIG_OUT 445 is controlled and starts operation at a known level corresponding to a logic level. After the start up is complete, the initial state is maintained until a complementary signal is received at the input. In an example, SIG_OUT 445 starts at a "logic low" voltage (i.e., at or near the voltage of the first negative supply voltage VSSH) for the high voltage domain. In another example, SIG_OUT can be held at a "logic high" voltage (i.e., at or near the first positive supply voltage VDDH). STARTUP 410 holds the circuitry in HVC 440 and ISO 430 stable during the power up time. After the power is stable and at a determined level, the block STARTUP 410 is disabled and is no longer active.

Block PGS 420 in the low voltage domain portion of the level shifter 400 receives an input signal on line SIG_IN 425. From the input signal, PGS 420 creates the complementary second set and reset signals IN_R and IN_S. At each transition of the signal on the input SIG_IN, PGS 420 outputs a short duration EN (enable) pulse, such as ten nanoseconds. The signals IN_R, IN_S, and EN couple to ISO 430 as shown in FIG. 4. ISO 430 provides communication and high voltage isolation protection for the low voltage domain signals in PGS 420 using a single pair of DEMOS transistors (not visible in FIG. 4, but described further hereinbelow). The EN pulse from PGS 420 determines the length of time that the ISO 430 receives power. In periods that the ISO 430 is not powered, no current flows in the circuit in ISO 430.

In FIG. 4, block HVC 440 provides the high voltage domain logic output on line SIG_OUT 445. The HVC 440 contains at least one set-reset (SR) latch (not shown in FIG. 4 but described hereinbelow). The latch ensures that during the time the level shifter 400 is powered and not responding to an input transition, the high voltage domain logic level on SIG_OUT 445 is maintained at a stable level. The HVC 440 processes set and reset signals during the time when the EN pulse is active as described hereinabove. When the EN pulse is active, the latch within HVC 440 can change state depending on the signal on line SIG_IN, and the latch state determines the voltage on the output SIG_OUT 445. In some arrangements, as is further described hereinbelow, the latch is implemented using a pair of back to back inverters, each of the inverters having an independent positive supply voltage. The positive supply voltages to the inverters are reduced asymmetrically in response to a change at the input. By supplying one inverter with a full VDDH positive supply voltage, while the other inverter is supplied with a reduced positive supply voltage, the latch transition from a first logic state to a second logic state is made faster, increasing circuit performance.

Figure 5:
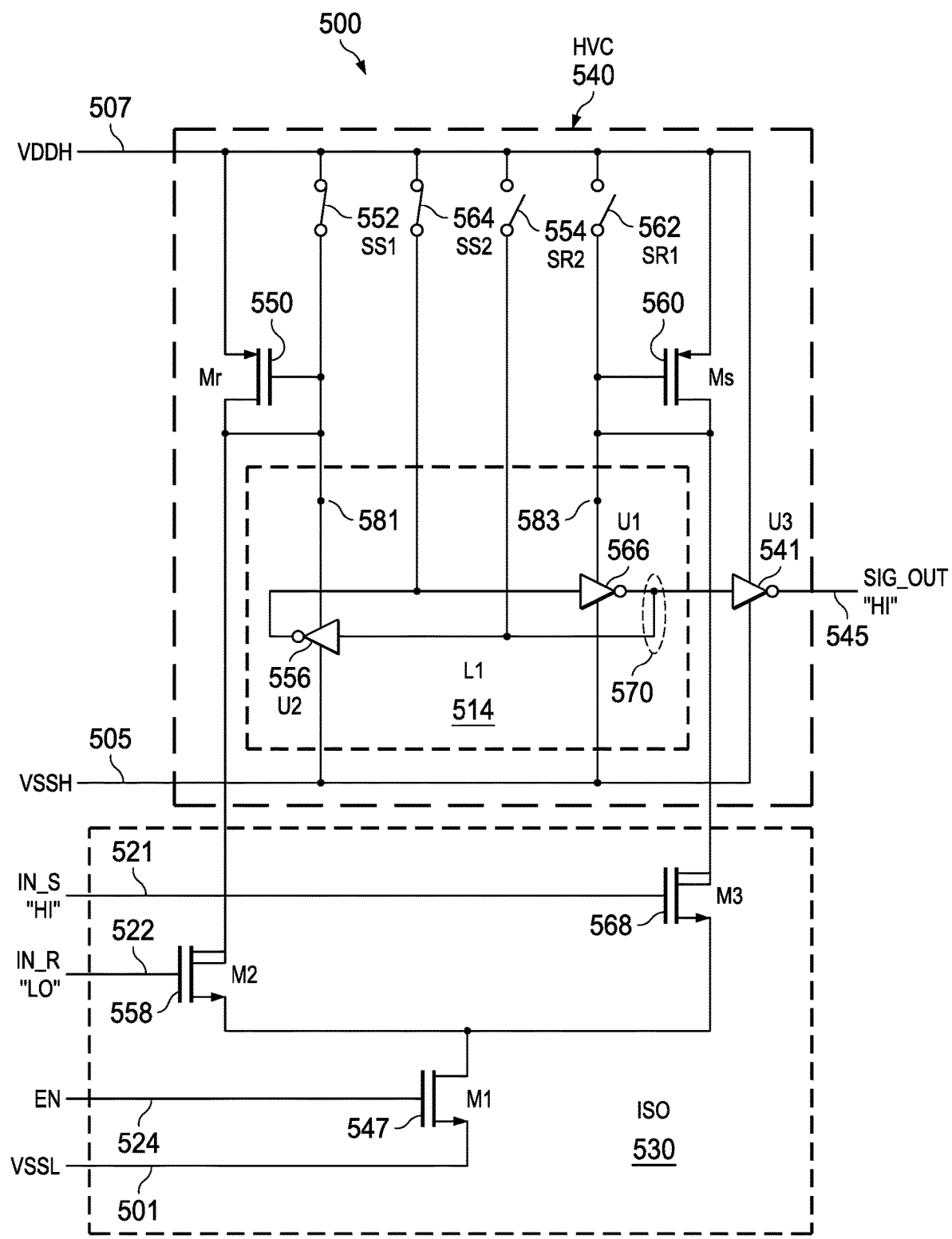
FIG. 5 is a block diagram of an example high voltage core and isolation circuit for a level shifter.

FIG. 5 is a block diagram of an example 500 for a high voltage core 540 and isolation circuit 530 for a high speed, symmetric level shifter with zero quiescent power. For example, the block diagram of FIG. 5 is suitable to implement blocks ISO 430 and HVC 440 of FIG. 4. The example 500 has: (a) five MOSFETS, which are M1 547, M2 558, M3 568, Mr 550 and Ms 560; (b) four switches, which are SS1 552, SS2 564, SR1 562 and SR2 554; (c) three inverters, which are U1 566, U2 556 and U3 541; (d) three power supply inputs, which are for the first positive supply voltage VDDH 507, the first negative supply voltage VSSH 505 and the second negative supply voltage VSSL 501; (e) three signal inputs, which are the second set signal IN_S 521, the second reset signal INS_R 522 and the enable signal EN 524; and (f) one output, which is SIG_OUT 545. The inverters U1 566 and U2 556 receive positive and separate first and second inverter supply voltages from nodes 583 and 581, respectively, which supply voltages are developed independently as is further described hereinbelow.

An active pulse signal on input EN 524 couples to the gate terminal of M1 547, input IN_S 521, the second set signal, couples to the gate terminal of M3 568 and input IN_R, the second reset signal, couples to the gate terminal of M2 558. Output SIG_OUT 545 couples to the output terminal of inverter U3 541. The second negative supply voltage signal VSSL 501 couples to the source terminal of M1 547. The first negative supply voltage VSSH 505 is coupled to the negative power supply terminals for three inverters; U1 566, U2 556 and U3 541. The first positive supply voltage VDDH 507 couples to the positive power supply of U3 541, the source terminal of Ms 560, the source terminal of Mr 550, the first terminals of four switches SS1 552, SR2 554, SS2 564 and SR1 562. The second terminal of SS1 552 couples to the drain and gate terminals of Mr 550, the drain terminal of M2 558 and the positive supply 581 of U2 556. The second terminal of SR1 562 couples to the drain and gate terminals of MS 560, the positive power supply 583 of U1 566 and the drain terminal of M3 568. The second terminal of SR2 554 couples to the input of U2 556, the input of U3 541 and the output of U1 566. The second terminal of SS2 564 couples to the input of U1 566 and the output of U2 556. The drain terminal of M1 547 couples to the source terminals of M2 558 and M3 568.

The high voltage domain first positive supply voltage VDDH 507 and first negative supply voltage VSSH 505 are positive and negative connections of a first power supply (PS1), respectively. The second positive supply voltage VDDL (not shown) and the second negative supply voltage VSSL 501 are positive and negative connections of a second power supply (PS2), respectively. The power supplies PS1 and PS2 are from separate voltage domains where the PS1 domain is a higher voltage domain. In an example, the high voltage first positive supply voltage VDDH of the PS1 domain can be greater than the low voltage second positive supply voltage VDDL of the PS2 domain by greater than 20 volts. In further examples, the positive voltage in the high voltage domain PS1 can be hundreds of volts greater than the positive voltage in the low voltage domain PS2 as the two domains are independent and floating with respect to one another.

Transistors M2 558 and M3 568 are DEMOS devices and these transistors provide protection for the low voltage domain components (not shown in FIG. 5) from the high voltage domain voltages. Inverters U1 566 and U2 556 have independent positive inverter supplies formed at nodes 582, 581 in FIG. 5, and together these back to back inverters form a latch L1 514. The independent inverter supplies at nodes 582, 581 are derived from the first positive supply voltage VDDH.

The input signals IN_S 521 and IN_R 522 are complementary set and reset signals from the low voltage domain. M1 547 is a MOSFET switch that is an enable transistor in that all current passing through the high voltage core 540 passes through M1 547 when the enable signal EN 524 is high. To achieve zero quiescent power, the EN 524 signal is low when no transition exists at the input (see FIG. 4, SIG_IN is the input), allowing no current to flow through the HVC 540, except for a predetermined duration time period when a state change occurs in the input signal in the low voltage domain. In an example, when a state change occurs in the low voltage domain, the enable signal EN 524 is made high only long enough, such as a duration of 5 nS, for the output SIG_OUT 545 to change state and for the latch L1 514 to stabilize and to preserve the output state.

Transistors Ms 560 and Mr 550 are configured as diodes that conduct when the gate to source voltage $V_{GS}$ is greater than the threshold voltage $(V_T)$ of the diode configured transistors.

The switching of SS1 552 and SS2 564 is coupled (not shown) to the gate to source voltage $(V_{GS})$ of Ms 560. When the gate to source voltage of Ms 560 is less than a threshold voltage, then the switches SS1 552 and SS2 564 are open. The switching of SR1 562 and SR2 554 is coupled (not shown) to the $V_{GS}$ of Mr 550. When the $V_{GS}$ of Mr 550 is less than a threshold voltage, then switches SR1 562 and SR2 554 are open.

The state of the four switches SS1 552, SS2 564, SR2 554, SR1 562 shown in block diagram 500 is a result of a logic high (HI) signal applied to the input IN_S 521, the second set signal, and a logic low (LO) signal applied to IN_R 522, the second reset signal. A change of state (detected in the PGS block as described hereinbelow) results in a logic HI on the enable signal EN 524, which turns transistor M1 547 on, allowing current to flow. The logic HI applied to IN_S 521 results in M3 568 conducting current through Ms 560. The output of M3 is a first set signal. The current flowing through Ms 560 raises the gate to source voltage $V_{GS}$ sufficiently to close the switches SS1 552 and SS2 564. The closing of SS1 552 makes the $V_{GS}$ of Mr 550 approximately zero, resulting in SR1 562 and SR2 554 being open as shown in the block diagram 500. SS2 564 drives the input to U1 566 to a logic HI resulting in node 570 at the inverter output going low.

With node 570 in the LO state, U3 541 changes SIG_OUT 545 to a logic HI and U2 556 changes state, locking the latch L1 514. During the period when the HVC 540 is enabled, the inverter positive supply of U2 556 (at node 581) is directly coupled to the first positive supply voltage VDDH 507 through SS1 552. Inverter U1 566 has a reduced positive inverter supply (at node 583) because the voltage at node 583 is VDDH 507 reduced by the gate to source voltage of Ms 560. The imbalance of the positive power supplies between the inverters U1 and U2 expedites the logic state transition and latching of latch L1 514. When the circuitry in example 500 including HVC 540 is disabled (due to no enable signal at input EN), no current flows through M1 547, the inverter power supplies for U1 566 and U2 556 equalize, maintaining the latch state. The HVC 540 is configured symmetrically and a change of logic state where the second reset signal IN_R 522 is a HI and the second set signal IN_S 521 is LO results in similar operation as described hereinabove, with the latch L1 514 and SIG_OUT 545 changing to the opposite logic state. In this case, the positive inverter supply for U2 556 (at node 581) will be reduced when compared to the inverter positive power supply for U1 566 (at node 583, which is at the first positive supply voltage VDDH) during the transition, which speeds the latch L1 514 transition to the new state.

Figure 6:
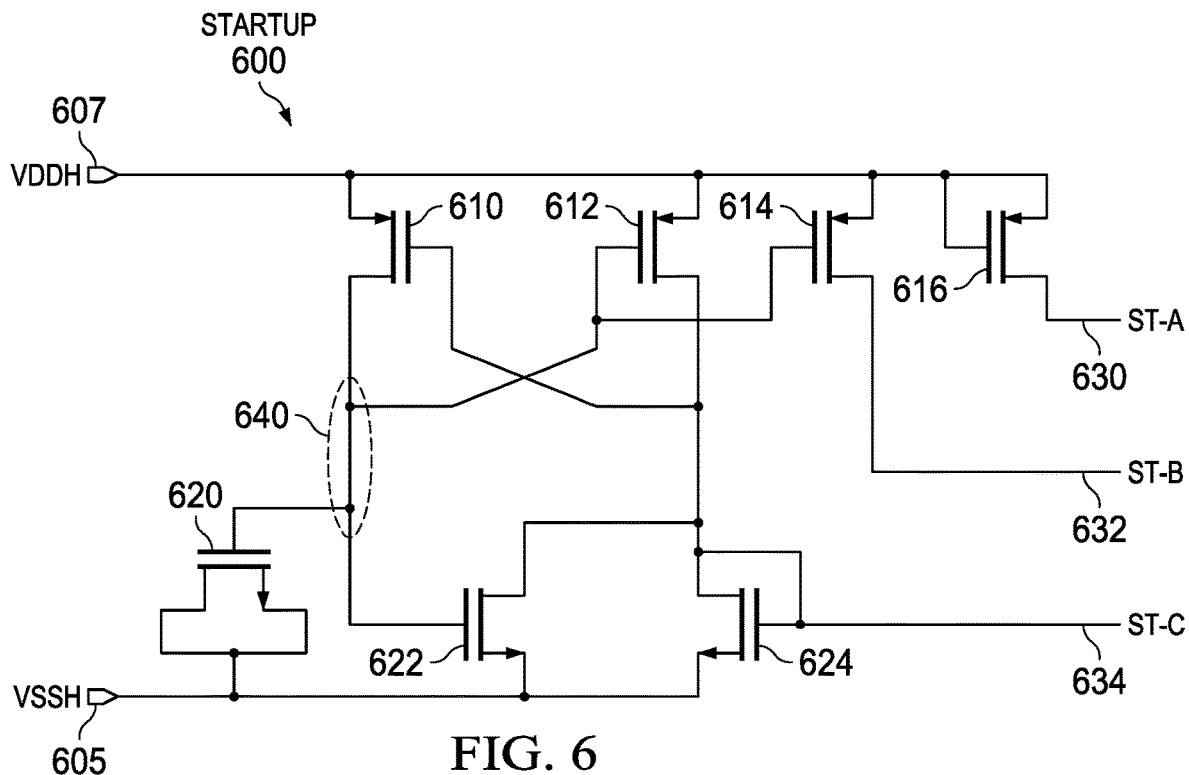
FIG. 6 is a schematic diagram of an example startup section for a level shifter.

FIG. 6 is a schematic diagram of an example startup section 600 for a high speed, symmetric level shifter with zero quiescent power. For example, the circuit in FIG. 6 can implement the STARTUP 410 of FIG. 4. STARTUP 600 has four PMOS transistors 610, 612, 614, 616, three NMOS transistors 620, 622, 624 and is part of the high voltage domain. VDDH 607 is the high voltage domain first positive supply voltage and VSSH 605 is the high voltage domain first negative supply voltage. STARTUP 500 has three outputs: ST-A 630, ST-B 632 and ST-C 634.

The first positive supply voltage VDDH 607 couples to the source terminals of the PMOS transistors 610, 612, 614 and to the source and gate terminals of PMOS transistor 616. VSSH 605 couples to the source terminals of NMOS transistors 622, 624 and the source and drain terminals of NMOS transistor 620. Transistor 620 is coupled as a capacitor, with the gate oxide acting as the capacitor dielectric. The drain terminal of PMOS transistor 610 couples to the gate terminals of NMOS transistors 620, 622 and gate terminals of PMOS 612, 614. The drain terminal of PMOS 612 couples to the drain terminal of NMOS 622 and to the drain and gate terminals of NMOS 624 and output 634. The drain terminal of PMOS 614 couples to output 632 and the drain terminal of PMOS 616 couples to output 630.

In operation, STARTUP 600 ensures that when the first positive supply voltage and the first negative supply voltage (VDDH and VSSH) first begins to power up, the output signal of the level shifter (such as HVC 440 in FIG. 4) is in a predetermined logic state, either high or low (e.g., according to a system's particular specification). Referring to FIG. 6, STARTUP 600 has outputs ST-A 630, ST-B 632 and ST-C 634 that initialize the HVC circuit in the aforementioned predetermined state. Before the positive supply voltage VDDH reaches a stable power level, internal nodes of STARTUP 600 are held at the first negative supply voltage VSSH 605 (at this point, VDDH approximately equals VSSH). When the high voltage domain first positive supply VDDH increases during start up, VDDH 607 ramps up with respect to the first negative supply voltage VSSH 605, and the PMOS transistors 610, 612 and 614 turn on. PMOS transistors 610, 612 and 614 in turn begin to charge up nodes 640 and outputs ST-C 634 and ST-B 632 respectively.

NMOS 620, which acts as a capacitor, is appreciably larger than NMOS 624, and therefore guarantees that node 634 is charges faster than node 640. However, NMOS 624 is configured as a diode and will clamp node 634 to not more than one gate-source voltage above the first negative supply voltage VSSH, whereas the capacitor configuration of NMOS 620 allows node 640 to continue charging up towards the VDDH. In the time interval where node 634 is higher in potential than node 640, NMOS 624 provides a bias voltage and PMOS 614 provides a bias current to the HVC circuit at outputs ST-C 634 and ST-B 632, respectively.

In time, node 640 will charge to a higher potential than node 634 after the capacitor coupled NMOS 620 charges, and NMOS 622 will begin to conduct and pull node 634 down to the first negative supply voltage VSSH. In turn, PMOS 610 is driven stronger and pulls node 640 up to the first positive supply voltage VDDH. In the final state: NMOS 620 is charged to the first positive supply voltage VDDH; NMOS 624 is in shut-off mode, with the gate, drain and source coupled to the first negative supply voltage VSSH; PMOS transistors 612 and 614 are in shut-off state with their gates coupled to VDDH; output ST-C 634 is held at VSSH; and output ST-B 632 is a high impedance node. Finally, PMOS 616, configured similar to PMOS 614 in its final state, presents the same parasitic values to output ST-A 630 and maintains the balance with output ST-B 632, and symmetry of the level shifter transient response as described hereinbelow.

Figure 7:
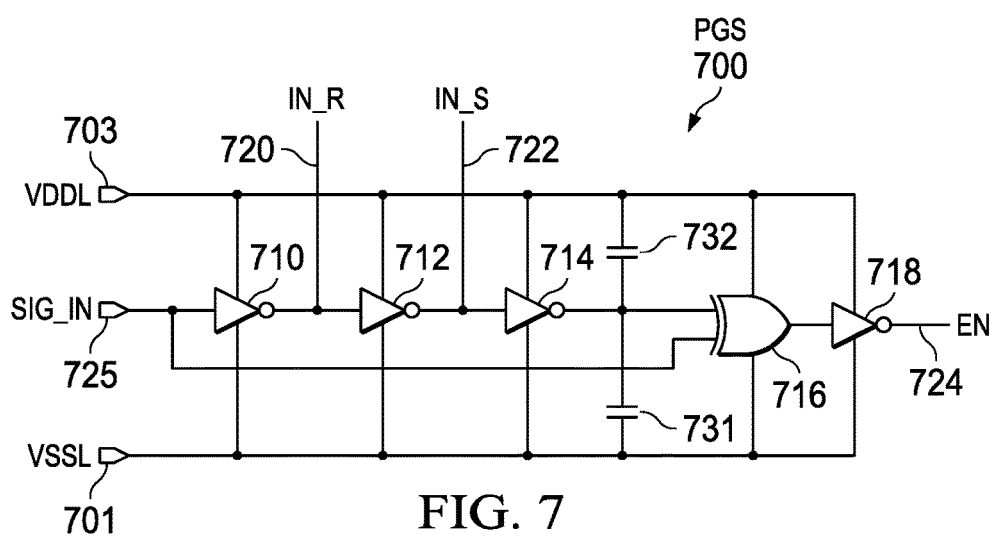
FIG. 7 is a schematic diagram of an example pulse generator section for a level shifter.

FIG. 7 is a circuit diagram of an example pulse generator section for a high speed, symmetric level shifter with zero quiescent power. PGS (pulse generator section) 700 can be used to implement the PGS block 420 in FIG. 4. In FIG. 7, PGS 700 has four inverters 710, 712, 714, 718, exclusive or (XOR) gate 716, and two capacitors 731, 732. PGS 700 is part of the low voltage domain. The low voltage domain includes the second positive supply voltage VDDL 703 as described hereinabove, and the second negative supply voltage or ground potential VSSL 701. The low voltage domain may have an example voltage range of 0 to 7 volts between the voltages VDDL and VSSL. PGS 700 has an input line SIG_IN 725, two output lines IN_R 720 (indicating a reset input), IN_S 722 (indicating a set input) and an enable output EN 724. VSSL 701 couples to the inverters 710, 712, 714, 718, XOR gate 716, and the first terminal of capacitor 731. VDDL 703 is coupled to the inverters 710, 712, 714, 718, the XOR gate 716 and the first terminal of capacitor 732.

Input SIG_IN 725 couples to a delay line including the inverter 710, inverter 712, and inverter 714 that couples to the first terminal of the XOR gate and the second terminals of capacitors 731 and 732. The second input terminal of the XOR gate 716 couples to SIG_IN 725. The output of the XOR gate 716 couples to inverter 718.

In steady state operation, with the input line SIG_IN 725 at a logic low, the XOR gate 716 has inputs of logic low from SIG_IN 725 and logic high from inverter 714, resulting in an output of logic high to the input of inverter 718. Inverter 718 inverts the logic high, outputting a logic low signal on line EN 724.

In operation, when a positive transition is applied to SIG_IN 725, the positive edge is applied directly to the XOR gate 716 resulting in both inputs to XOR gate 716 being at a logic high. The two logic high inputs result in the output of the XOR gate 716 switching from a high state to logic low. The output of XOR 716 couples to inverter 718. Inverter 718 outputs logic high to output line EN 724. EN 724 continues to be logic high until the XOR gate receives a delayed signal of an inverted SIG_IN 725. The time delay through inverters 710, 712 and 714 determines the duration of the pulse on line EN 724. For this example, the pulse duration on line EN_624 is five nanoseconds to ten nanoseconds. Capacitors 731 and 732 add additional delay to the first terminal of XOR 716 resulting in an elongation of the pulse on line EN 724. In alternative arrangements, additional capacitance or inverter pairs 712 and 714 can be added to adjust the pulse duration on EN 724. After the inverted signal SIG_IN 725 reaches the input of the XOR gate 716, the XOR gate 716 inputs will be opposite logic levels and the output of the XOR gate 716 will output logic high. The logic high signal is coupled to inverter 718, which inverts the logic high signal to logic low, and inverter 718 then outputs a low on the line EN 724.

When the input SIG_IN transitions from a high level to a low level, the outputs IN_R, IN_S will track the input with IN_R 720 the inverse of the voltage at the SIG_IN 725 terminal, and the output IN_S 722 being the same polarity as the voltage at the SIG_IN 725 terminal. The XOR gate 716 will have a logic low at the input directly coupled to the SIG_IN terminal, and a logic low will be at the second input temporarily, so the output of the XOR gate 716 will be a zero, and the inverter 718 will output logic high. After the delay lines 710, 712, 714 couple the change at the input to the XOR gate 716, the inputs will no longer be equal, and the XOR gate 716 will output logic high, and the inverter 718 will transition to a logic low. The duration of the pulse on the EN line is determined by the delays of inverters 710, 712, 714 and the capacitors 732, 731 as described hereinabove. Accordingly, the pulse generator section 700 generates an enable pulse on the output EN each time the voltage at input SIG_IN 725 changes.

Figure 8:
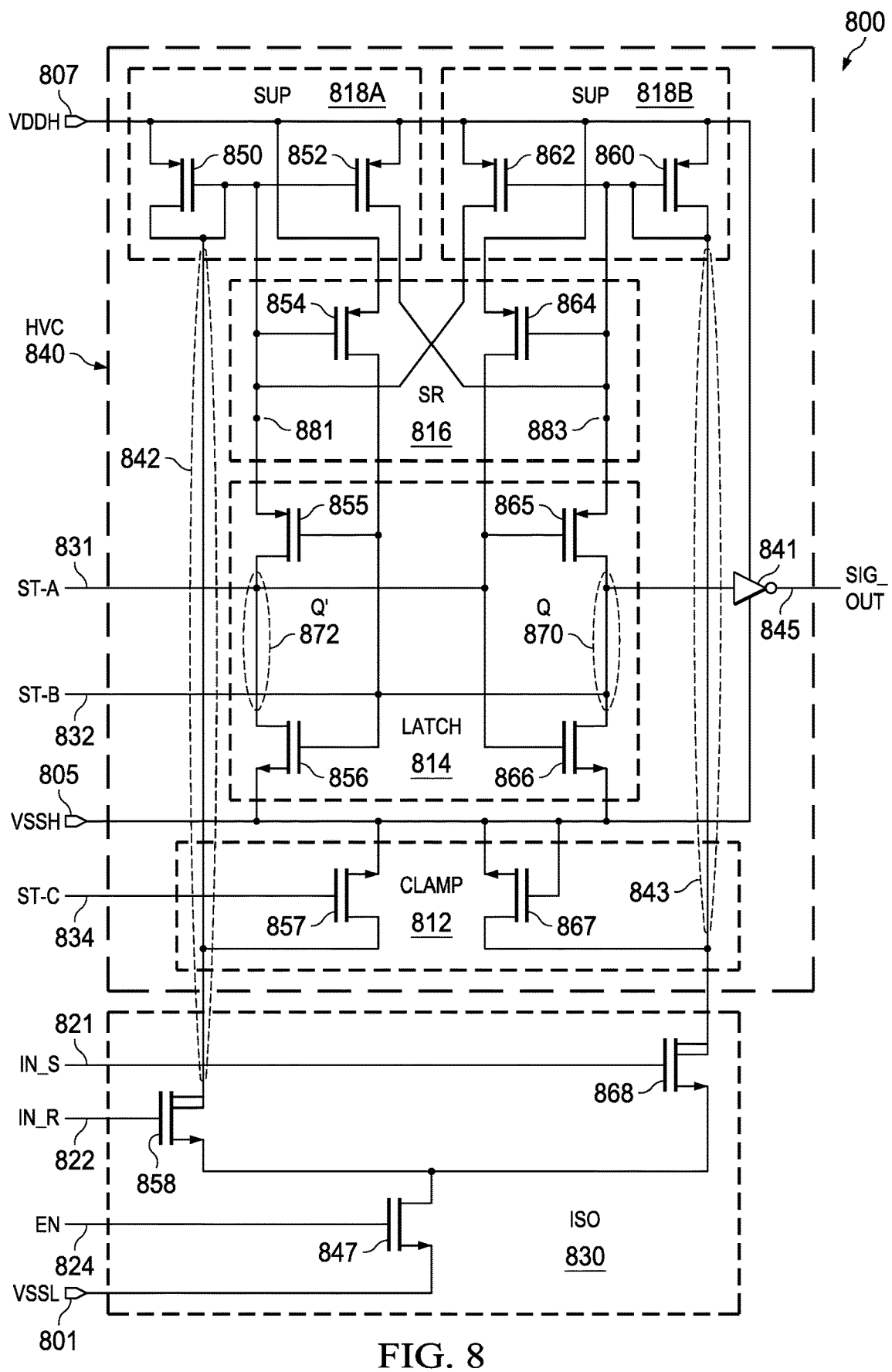
FIG. 8 is a schematic diagram of another example high voltage core and isolation circuit of a level shifter.

FIG. 8 is a circuit diagram of an example 800 for a high voltage core HVC 840 and an isolation circuit 830 of a high-speed, symmetric level shifter with zero quiescent power. For example, HVC 840 can implement the HVC 540 of FIG. 5. HVC 840 has three power supply terminals: the low voltage domain second negative supply voltage or ground potential VSSL 801 that is similar to VSSL 501 in FIG. 5, the high voltage domain first negative supply voltage or ground reference potential VSSH 805 that is similar to VSSH 505 in FIG. 5, and the high voltage domain first positive supply voltage VDDH 807 that is similar to VDDH 507 in FIG. 5. The example 800 is divided into several blocks: ISO 830 (isolation); and HVC 840, which includes: CLAMP 812; LATCH 814; SR 816 (set and reset); SUP 818A (supply A); SUP 818B (supply B); and an inverter 841.

The block ISO 830 includes less than two pairs of DEMOS transistors, that is only a single pair of N-type DEMOS transistors 858 and 868, which are similar to transistors M2 558 and M3 568 of FIG. 5. Also, block ISO 830 includes a transistor NMOS 847 comparable to transistor M1 547 of FIG. 5. CLAMP 812 has two NMOS transistors 857, 867. LATCH 814 includes a pair of transistors 865 and 866, which together form an inverter comparable to U1 566 of FIG. 5. Also, LATCH 814 includes another pair of transistors 855 and 856, which together form an inverter comparable to U2 556 of FIG. 5. Transistors 855 and 865 are PMOS transistors and transistors 856 and 866 are NMOS transistors. SR block 816 has two PMOS transistors 854, 864 comparable to switches 554 and 564 of FIG. 5, respectively. SUP 818A has two PMOS transistors 850, 852. SUP 818B has two PMOS transistors 860, 862. Transistor 850 is comparable to transistor Mr 550 of FIG. 5, and transistor 852 is comparable to switch SS1 552 of FIG. 5. Transistor 860 is comparable to transistor Ms 560 of FIG. 5, and transistor 862 is comparable to switch SR1 562 of FIG. 5. HVC 800 has: (a) six inputs, which are 820 IN_S, 822 IN_R, 824 EN (enable), 830 ST-A (startup A), 832 ST-B (startup B) and 834 ST-C (startup C); and (b) one output line, which is SIG_OUT 845.

The low voltage domain second negative supply voltage or ground reference potential VSSL 801 couples to the source terminal of NMOS transistor 847. The high voltage domain first negative supply voltage or ground reference potential VSSH 805 is coupled to the source terminals of transistors NMOS 856, NMOS 857, NMOS 866, NMOS 867, the gate terminal of NMOS 867 and first power terminal of inverter 841. The high voltage domain first positive supply voltage VDDH 807 is coupled to the source terminals of transistors PMOS 850, PMOS 852, PMOS 854, PMOS 860, PMOS 862, PMOS 864 and the second power terminal of inverter 841. An input line EN 824 for receiving an enable signal couples to the gate terminal of NMOS 847. An input line IN_S 821, a second set signal, couples to the gate terminal of DEMOS 868. An input line IN_R 822, a second reset signal, couples to the gate terminal of DEMOS 858. Nodes 842 and 843 receive these inputs as active low signals and correspond to the first reset and set signals RST_ and SET_ of ISO block 430 in FIG. 4. The input line ST-C 834 is coupled to the gate terminal of NMOS 857. The input line ST-B 832 is coupled to the gate terminal of NMOS 856, the gate terminal of PMOS 855, the drain terminal of PMOS 854, the drain terminal of NMOS 866, the drain terminal of PMOS 865 and the input of inverter 841. The input line ST-A 831 is coupled to the drain terminal of PMOS 855, the drain terminal of NMOS 856, drain terminal of PMOS 864, gate terminal of PMOS 865 and gate terminal of NMOS 866. The output line SIG_OUT 845 is coupled to the output terminal of inverter 841. In further examples, a second inverter (not shown) can provide an opposite polarity output signal by inverting SIG_OUT. In yet another alternative, a second inverter can provide an opposite polarity output signal by coupling to node 872, Q', and to an opposite polarity output terminal.

Node 842 (the first reset signal) couples the drain terminal of N type DEMOS 858, drain terminal of NMOS 857, drain terminal of PMOS 850, gate terminal of PMOS 850, gate terminal of PMOS 852, gate terminal of PMOS 854, drain terminal of PMOS 862 and the source terminal of PMOS 855. Node 843 (the first set signal) couples the drain terminal of N type DEMOS 868, gate and drain terminals of PMOS 860, drain terminal of NMOS 867, drain terminal of PMOS 852, source terminal of PMOS 865, gate terminal of PMOS 864 and the gate terminal of PMOS 862. The drain terminal of NMOS 847 couples to the source terminal of DEMOS 858 and the source terminal of DEMOS 868.

In operation, the isolation circuit ISO 830 receives low voltage domain input signals on the complimentary inputs IN_S 821 and IN_R 822 (from a pulse generator such as shown in FIG. 7) and those input signals drive the gate terminals of the single pair of DEMOS transistors 868 and 858, respectively. The DEMOS transistors provide high voltage isolation and communication from the low voltage domain portion of the circuit 800 to the high voltage domain portion. The input line EN 824 receives a positive pulse from a pulse generator such as PGS 700 in FIG. 7. The line EN 824 is logic low during inactive periods, causing NMOS 847 to turn off, resulting in zero quiescent current during inactive periods, because no current flows. During active periods, which are determined duration periods such as five to ten nanoseconds, an enable pulse on EN 824 is a logic high resulting in NMOS 847 fully conducting. Current can then flow through the circuitry needed to change the state of the latch 814 in HVC 840.

During transients, due to a change in the inputs IN_S 821 and IN_R 822 or a fast change in the high voltage domain reference potential VSSH 805, node 842 or node 843 may be pulled below the high voltage domain reference VSSH 805. To ensure device reliability, NMOS transistors 857 and 867 of CLAMP 812 operate in steady-state as P-N junctions and to clamp nodes 842 and 843 to a voltage that is a diode drop voltage below the high voltage domain reference VSSH 805.

The LATCH 814 block along with the SR 816 block is an S-R latch with the inputs at nodes 843, the first set signal, which is in response to the second set signal IN_S 821, and the first reset signal at node 842, which is in response to the second reset signal IN_R 822. The LATCH 814 has two inverters, one formed from transistors 855, 856, and one formed from transistors 865, 866; these correspond to the inverters U1 and U2 in FIG. 5; the inverters couple back to back to form the latch 814. The node 870 (Q) and node 872 (Q') complete the S-R latch with the inverter 841 input coupled to the Q node 870. The output SIG_OUT 845 is an inverted version of the node Q.

Supply blocks SUP 818A and SUP 818B in FIG. 8 are matching supply blocks. Referring to block SUP 818A, PMOS 850 is diode coupled with the gate and drain connected together. The diode configuration creates a low impedance at node 842 so that when DEMOS 858 and NMOS 847 turn on, a high current flows to charge the large parasitic capacitance found in DEMOS 858. PMOS 852 is the supply configuration switch for the inverter including PMOS 865 and NMOS 866 of the Q side of LATCH 814. The HVC 840 is configured symmetrically and SUP 818B works in the same manner as SUP 818A on the Q' side of the latch. PMOS 860 is diode connected with the gate and drain connected, and PMOS 860 feeds node 843 that is coupled to DEMOS 868. PMOS 862 is the supply configuration switch for the inverter including PMOS 855 and NMOS 856 of the Q' side of LATCH 814. With HVC 840 powered with high voltage domain power supply VDDH and high voltage reference potential VSSH and the low voltage domain reference potential VSSL each applied to the respective inputs, when the status of SIG_OUT 845 is a logic high state, Q node 870 is logic low, Q' node 872 is logic high, IN_S 821 is logic high and IN_R 822 is logic low.

When a positive voltage is received on the input IN_R 822, a corresponding low voltage is received on the second set signal IN_S 821 and a short duration pulse is received on EN 824. The pulse on EN 824 turns on NMOS 847 for the duration of the enable pulse. The positive voltage on the second reset signal IN_R 822 turns on DEMOS 858. As current flows through DEMOS 858 and NMOS 847, node 842 is pulled low towards the first negative supply voltage VSSH, and diode configured PMOS 850 turns on, allowing a high level of current to charge the parasitic capacitance in DEMOS 858 and reducing the positive inverter supply voltage of the PMOS 855 and NMOS 856 inverter on the Q' side of LATCH 814 to a supply voltage of VDDH minus the gate to source voltage (VGS) of PMOS 850. With node 842 appreciably below VDDH, PMOS 852 turns on and pulls node 843 towards VDDH thereby extending the inverter positive supply of the PMOS 865 and NMOS 866 inverter on the Q side of LATCH 814 to the first positive supply voltage VDDH. Similarly to PMOS 852, PMOS 854 turns on, pulling Q node 870 high towards the first positive supply voltage VDDH or logic high. With Q node 870 at logic high, PMOS 855 turns off and NMOS 856 turns on pulling Q' node 872 to the first negative supply voltage VSSH or logic low. In response, PMOS 865 turns on and NMOS 866 turns off, allowing the node Q 870 to couple through PMOS 865 and PMOS 852 to VDDH, and inverter 841 outputs a low voltage on SIG_OUT 845.

When the EN 824 signal returns to logic low, NMOS 847 turns off, closing the current path so that the quiescent power is zero during inactive periods. The logic within LATCH 814 and SR 816 holds the last output voltage, in this example a low voltage.

Referring again to FIG. 8, when the voltage at SIG_OUT 845 is at a logic low state, Q node 870 is at a logic high state, Q' node 872 is a logic low, the second set signal IN_S is at a logic low state, and the second reset signal IN_R is at a logic high state. When a positive voltage is received on the second set signal input IN_S 821, a corresponding low voltage is received on the second set signal IN_R 822, and a short duration pulse is received on EN 824. The pulse on EN 824 turns on NMOS 847 for the short duration pulse period. The positive voltage on the second set signal IN_S 821 turns on DEMOS 868. As current flows through DEMOS 868 and NMOS 847, the node 843 (the first set signal) is pulled low towards the first negative supply voltage VSSH, and diode configured PMOS 860 turns on, allowing a high level of current to charge the parasitic capacitance in DEMOS 868 and reducing the positive inverter supply voltage of the inverter of PMOS 865 and NMOS 866 on the Q side of LATCH 814 to a supply voltage (at node 883) of VDDH minus the gate to source voltage VGS of PMOS 860. With node 843 substantially below VDDH, PMOS 862 turns on, and pulls node 842 towards VDDH, and the supply for PMOS 855 and NMOS 856 towards the first positive supply voltage VDDH. PMOS 864 turns on pulling Q' node 827 to a logic high or towards VDDH. With Q' node 872 at a logic high, PMOS 865 turns off, and NMOS 866 turns on. NMOS 866 pulls the Q node 870 to a logic low, and the output SIG_OUT 845 is at a logic high voltage due to the operation of inverter 841. When the short duration pulse on EN 824 ends, NMOS 847 turns off, and the current path closes, so zero power is consumed during quiescent periods. As described hereinabove, the logic in latch 814 holds the last output voltage, in this example, a high voltage, at SIG_OUT 845.

An aspect of the operation of HVC 840 described hereinabove is the imbalance imposed on the supplies of the Q and Q' sides of LATCH 814 by the action of SUP 818A and SUP 818B. In the arrangements, the transition time for LATCH 814 is reduced by supplying one inverter with a positive supply level VDDH while the other inverter is supplied by a reduced voltage of VDDH minus a gate to source voltage drop. This allows the logic state transitions of the latch to occur faster (when compared with a similar latch formed without these features) and with very little power.

To enable a symmetric and fast transition within the arrangement 800, a low impedance path to the DEMOS transistors enables the large parasitic capacitors within the DEMOS transistors to charge quickly. At the same time, when a DEMOS transistor is active, the active low impedance path temporarily starves power to the half of the inverter with the active DEMOS transistor. The starving of the power supply for one inverter allows the complimentary inverter to change states using very little power. The operation ends when the EN pulse goes active low.

The example arrangements of FIGS. 4-7 provide a level shifter with zero quiescent current that includes no more than two DEMOS transistors in the isolation block. The arrangements reduce the silicon area required for the level shifter, and provide symmetric circuit operation. The positive voltage in the high voltage domain, VDDH, can vary over a wide range while correct circuit operation continues. The low impedance nodes 842, 843 in FIG. 8 provide a level shift circuit with fast rise and fall times Tr, Tf that enable high frequency operation in switching applications. In an example, a level shifter using the arrangement in FIG. 8 operated at 10 MHz. In an example, the blocks of FIG. 4, and the example implementations of FIG. 6, FIG. 7 and FIG. 8 form a single monolithic integrated circuit. In further examples, the blocks of FIG. 4 can be implemented on multiple integrated circuits.

In the arrangements described hereinabove, the isolation circuitry includes a single pair of DEMOS transistors, and the high voltage core features a pair of inverters with independent positive supply voltages that are asymmetric during a transition from one latch state to another latch state. But in alternative arrangements, these features are useful independently. Accordingly, a level shifter can incorporate the isolation circuitry of the arrangements using less than two pairs (e.g., one pair) of DEMOS transistors. Another arrangement level shifter can incorporate the high voltage core with inverters forming a latch, the inverters having independent positive supply voltages that are asymmetric during a transition to speed the transition from one latch state to another latch state. Further, as shown and described herein, a level shifter arrangement can include both the high voltage core with the inverters having independent positive supply voltages and an isolation circuit using only a single pair of DEMOS transistors as shown in FIG. 8. All of these arrangements are useful in various applications.

Figure 9:
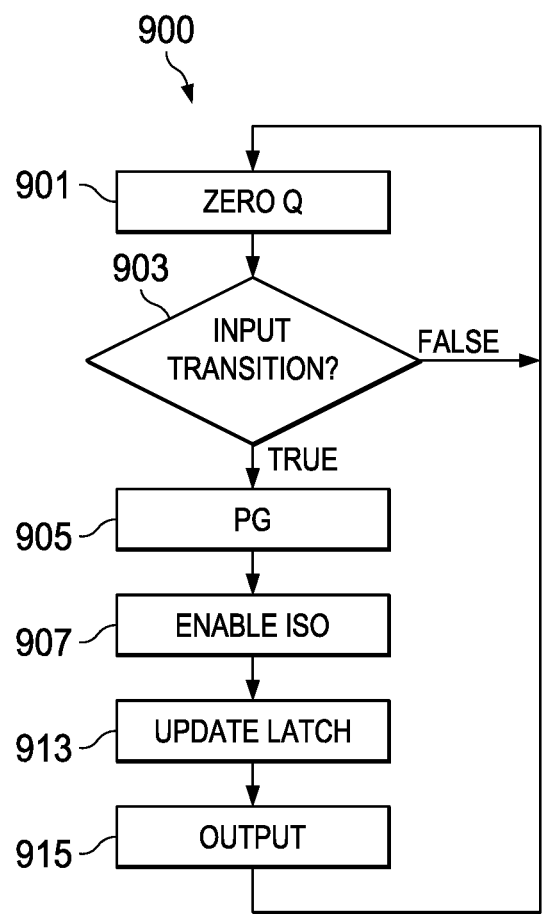
FIG. 9 is flow chart of an example operation of a level shifter with zero quiescent power.

FIG. 9 is a flow chart of an example operation of a high-speed, symmetric level shifter with zero quiescent power. In FIG. 9, at block 901, a latch powered by a high voltage domain supply voltage such as 45 volts is in an initial state with zero, or near zero, quiescent power consumption, and a stable output voltage.

At block 903, a decision is made. If a voltage transition in an input signal is detected the method transitions to block 905. If no transition is detected, the method returns to block 901 and continues operating with the current state of the latch at zero quiescent power. When a transition in the low voltage domain input signal occurs, the input signal changes from one logic level to a second different logic level, such as from low to high.

At block 905, PG, a pulse is generated. The pulse is generated using a pulse generator circuit that is powered by the low voltage domain. For example, the pulse generator circuit in FIG. 7 can be used. The pulse has a particular and limited duration, such as five nanoseconds to ten nanoseconds. The pulse duration can be determined using a delay line, capacitors, and combinations of these. The method continues to block 907.

At block 907, ENABLE ISO, the enable pulse generated at PG 905, is received by an isolation circuit. The isolation circuit becomes active in response. For example, the enable pulse can couple to the gate of a transistor coupled to a low voltage domain negative or ground potential supply. The isolation circuitry such as 830 shown in FIG. 8 can be used. The isolation circuitry can include a single pair of DEMOS transistors positioned between a low voltage domain negative supply voltage or ground potential, and a high voltage domain, such as in FIGS. 4 and 8.

At block 907, ENABLE ISO, the enable pulse enables the isolation circuit. The enable pulse allows second set and reset signals to be coupled to the high voltage domain latch through an isolation circuit. The isolation circuit can include a pair of DEMOS transistors such as is shown in the ISO block in FIG. 8. The enable pulse allows current to flow in the isolation circuitry after the second set and second reset signals are provided by the transition detection circuitry. The isolation circuit is only active during the active enable pulse, which limits the power consumed. After the enable pulse ends, the isolation circuitry becomes inactive and will no longer consume power.

At block 913 of FIG. 9, the latch in the high voltage domain updates. When the input signal in the low voltage domain transitions from one logic voltage to another, this transition indicates the output signal should change and that the latch in the high voltage domain should change state. The second set and second reset signals from the pulse generator circuit coupled into the isolation circuit to form first set and reset signals that are shifted to the high voltage domain by driver transistors in the high voltage core, and by the operation of the DEMOS transistors in the isolation circuit. For example, the nodes Q and Q' in the latch of FIG. 8 can change state in response to the low voltage domain set and reset signals.

The method then continues to block 915, Output. When the enable pulse ends, the latch state is stable. The latch value is output on an output line, such as SIG_OUT as is shown in FIG. 8.

In the example method, the level shift circuitry receives an input signal in the low voltage domain that causes a change in the output in the high voltage domain, thus the level shifter couples a low voltage domain input signal to a high voltage domain output line. The low voltage domain circuitry is isolated from the high voltages in the high voltage domain by DEMOS transistors. However, in the example arrangements, the number of DEMOS transistors is limited to two DEMOS transistors, thereby reducing the silicon area used in an integrated circuit including the level shifter. The power consumed is limited, because: (a) the circuit only consumes dynamic power when changing state; and (b) in the absence of a change at the input signal, the circuitry has zero quiescent power, because no current flows in the circuit. By using the latch that has a pair of inverters with independent positive voltage supplies (which are asymmetric following a transition), faster operation of the latch and the level shifter is achieved, thereby reducing transition times.

In an example, a level shifter implemented in silicon using the less than two pairs of DEMOS devices, the die size needed was 9300 microns squared, compared with a die size of 13500 microns squared for an approach for a level shifter formed without the example arrangements.

Modifications are possible in the described arrangements, and other arrangements are possible within the scope of the claims.

What is claimed is:

1. Apparatus, comprising:
a latch coupled to a first positive voltage terminal and to a first negative voltage terminal, in which: the latch has a first inverter and a second inverter coupled to one another back to back; the latch has a first set input and a first reset input; and the latch is configured to output a latch state voltage indicating first or second latch states, responsive to the first set input and the first reset input; and
an isolation circuit coupled to a second positive voltage terminal and to a second negative voltage terminal, in which: the isolation circuit has a second set input, a second reset input, and an enable input; a voltage at the second positive voltage terminal is independent of a voltage at the first positive voltage terminal; the isolation circuit is configured to output a first set signal to the first set input and a first reset signal to the first reset input, responsive to a second set signal at the second set input and a second reset signal at the second reset input; and the isolation circuit includes less than two pairs of drain extended metal oxide semiconductor (DEMOS) transistors.

2. The apparatus of claim 1, wherein the isolation circuit includes the second set input and the second reset input coupled to gate terminals of respective ones of the less than two pairs of DEMOS transistors.

3. The apparatus of claim 2, wherein the isolation circuit includes: a metal oxide semiconductor (MOS) transistor having source and drain terminals coupled between the second negative voltage terminal and source terminals of the less than two pairs of DEMOS transistors, and wherein the MOS transistor has a gate terminal coupled to the enable input.

4. The apparatus of claim 1, wherein the voltage at the first positive voltage terminal is at least 20 volts greater than the voltage at the second positive voltage terminal.

5. The apparatus of claim 1, wherein the voltage at the first positive voltage terminal is at least 5 volts greater than the voltage at the first negative voltage terminal.

6. The apparatus of claim 1, wherein a voltage at the second negative voltage terminal is independent of a voltage at the first negative voltage terminal.

7. The apparatus of claim 6, wherein the voltage at the second positive voltage is at least 5 volts greater than the voltage at the second negative voltage terminal.

8. The apparatus of claim 6, wherein the voltage at the second positive voltage is at least 3 volts greater than the voltage at the second negative voltage terminal.

9. The apparatus of claim 1, wherein the first inverter is coupled to a first inverter voltage terminal, and the second inverter is coupled to a second inverter voltage terminal, in which a voltage from the first inverter voltage terminal and a voltage from the second inverter voltage terminal are different.

10. The apparatus of claim 9, further comprising: a voltage core including the latch; a first diode connected transistor coupled to the first positive voltage terminal and configured to output the voltage from the first inverter voltage terminal; and a second diode connected transistor coupled to the first positive voltage terminal and configured to output the voltage from the second inverter voltage terminal.

11. The apparatus of claim 10, wherein the voltage core is configured to cause a difference between the voltage from the first inverter voltage terminal and the voltage from the second inverter voltage terminal, responsive to a transition in the first set signal or the first reset signal.

12. The apparatus of claim 11, wherein the voltage core is configured to cause the voltage from the first inverter voltage terminal or from the second inverter voltage terminal to be less than the voltage at the first positive voltage terminal by a gate to source voltage drop of the first diode connected transistor or of the second diode connected transistor, responsive to a transition in the first set signal or the first reset signal.

13. The apparatus of claim 12, wherein: the first diode connected transistor is a first PMOS transistor having a gate terminal and a drain terminal coupled together and having a source terminal coupled to the first positive voltage terminal; the first PMOS transistor is coupled to the first reset input from a first DEMOS transistor in the isolation circuit; the first DEMOS transistor is coupled to the second reset input; the voltage core includes the second diode connected transistor, which is a second PMOS transistor having a drain terminal and a gate terminal coupled together and having a source terminal coupled to the first positive voltage terminal; the second PMOS transistor is coupled to the first set input from a second DEMOS transistor in the isolation circuit; and the second DEMOS transistor is coupled to the second set input.

14. The apparatus of claim 1, further comprising a startup circuit including:
a first output coupled to an input of the first inverter;
a second output coupled to an input of the second inverter; and
a transistor coupled as a capacitor to charge from the voltage at the first negative voltage terminal to the voltage at the first positive voltage terminal during a power up of the first positive voltage terminal.

15. The apparatus of claim 14, wherein the startup circuit is configured to output a low voltage at the first output or at the second output during a power up of the first positive voltage terminal, and the first and the second outputs are coupled to the latch and configured to force the latch to a particular logic state until the capacitor charges.

16. The apparatus of claim 15, wherein the latch and the startup circuit do not include DEMOS transistors.

17. An integrated circuit, comprising:
a latch coupled to a first positive voltage terminal and to a first negative voltage terminal, in which: the latch has a first inverter and a second inverter coupled to one another back to back; the latch has a first set input and a first reset input; and the latch is configured to output a latch state voltage indicating first or second latch states, responsive to the first set input and the first reset input; and
an isolation circuit coupled to a second positive voltage terminal and to a second negative voltage terminal, in which: the isolation circuit has a second set input, a second reset input, and an enable pulse input; a voltage at the second positive voltage terminal is independent of a voltage at the first positive voltage terminal; the isolation circuit includes less than two pairs of drain extended metal oxide semiconductor (DEMOS) transistors configured to output a first set signal to the first set input and a first reset signal to the first reset input; and the isolation circuit includes an enable transistor coupled to the second negative voltage terminal and to the enable pulse input.

18. The integrated circuit of claim 17, wherein the less than two pairs of DEMOS transistors are N-type DEMOS transistors.

19. The integrated circuit of claim 17, wherein the enable transistor includes an N-type metal oxide semiconductor (MOS) transistor having a source terminal and a drain terminal coupled between the second negative voltage terminal and source terminals of the less than two pairs of DEMOS transistors, and the N-type MOS transistor has a gate terminal coupled to the enable pulse input.

20. The integrated circuit of claim 19, wherein the latch does not include DEMOS transistors.

21. The integrated circuit of claim 17, wherein the first inverter is coupled to a first inverter voltage terminal, and the second inverter is coupled to a second inverter voltage terminal, in which a voltage from the first inverter voltage terminal and a voltage from the second inverter voltage terminal are different.

22. The integrated circuit of claim 21, further comprising:
a first diode connected transistor coupled to the first positive voltage terminal and configured to output the voltage from the first inverter voltage terminal; and
a second diode connected transistor coupled to the first positive voltage terminal and configured to output the voltage from the second inverter voltage terminal.

23. The integrated circuit of claim 17, wherein the voltage at the first positive voltage terminal is at least 20 volts greater than the voltage at the second positive voltage terminal.

24. Apparatus, comprising:
a latch coupled to a first positive voltage terminal and to a first negative voltage terminal, in which: the latch has a first inverter and a second inverter coupled to one another back to back; the latch has a first set input and a first reset input; the latch is configured to output a latch state voltage indicating first or second latch states, responsive to the first set input and the first reset input; the first inverter is coupled to a first inverter voltage terminal; the second inverter is coupled to a second inverter voltage terminal; and a voltage from the first inverter voltage terminal and a voltage from the second inverter voltage terminal are different; and
an isolation circuit coupled to a second positive voltage terminal and to a second negative voltage terminal, in which: the isolation circuit has a second set input, a second reset input, and an enable input; a voltage at the second positive voltage terminal is independent of a voltage at the first positive voltage terminal; and the isolation circuit is configured to output a first set signal to the first set input and a first reset signal to the first reset input, responsive to a second set signal at the second set input and a second reset signal at the second reset input.

25. The apparatus of claim 24, further comprising:
a voltage core including: the latch; a first diode connected transistor coupled to the first positive voltage terminal and configured to output the first inverter voltage to the first inverter; and a second diode connected transistor coupled to the first voltage positive terminal and configured to output the voltage from the second inverter voltage terminal to the second inverter.

26. The apparatus of claim 25, wherein the voltage core is configured to cause a difference between the voltage from the first inverter voltage terminal and the voltage from the second inverter voltage terminal, responsive to a transition in the first set signal or the first reset signal.

27. The apparatus of claim 26, wherein the voltage core is configured to cause the voltage from the first inverter voltage terminal or from the second inverter voltage terminal to be less than the voltage at the first positive voltage terminal by a gate to source voltage drop of the first diode connected transistor or of the second diode connected transistor, responsive to a transition in the first set signal or the first reset signal.

28. The apparatus of claim 26, wherein: the first diode connected transistor is a first PMOS transistor having a gate terminal and a drain terminal coupled together and having a source terminal coupled to the first positive voltage terminal; the first PMOS transistor is coupled to the first reset input from a first DEMOS transistor in the isolation circuit; the first DEMOS transistor is coupled to the second reset input; the voltage core includes the second diode connected transistor, which is a second PMOS transistor having a drain terminal and a gate terminal coupled together and having a source terminal coupled to the first positive voltage terminal;

the second PMOS transistor is coupled to the first set input from a second DEMOS transistor in the isolation circuit; and the second DEMOS transistor is coupled to the second set input.

29. A method, comprising:
- detecting a transition in a logic input signal;
- generating an enable pulse having an active portion of a particular duration responsive to detecting the transition;
- coupling the enable pulse to an isolation circuit that includes less than two pairs of drain extended metal oxide semiconductor (DEMOS) transistors, the isolation circuit being coupled between: a first voltage core having a first positive voltage terminal and a first negative voltage terminal; and a second voltage core having a second positive voltage terminal and a second negative voltage terminal;
- outputting first set and first reset signals from the isolation circuit to a set-reset latch in the first voltage core, which is supplied by the first positive voltage terminal and by the first negative voltage terminal, in which a voltage at the first positive voltage terminal is independent of a voltage at the second positive voltage terminal, and the set-reset latch has a latch output terminal having a state indicating a logic state of the set-reset latch; and
- outputting an output signal to the latch output terminal.

30. The method of claim 29, wherein the isolation circuit includes less than two pairs of N-type DEMOS transistors.

31. The method of claim 29, wherein current flows in the isolation circuit during only the active portion of the enable pulse.

* * * * *